(12) United States Patent
Sheridan et al.

(10) Patent No.: US 8,202,772 B2
(45) Date of Patent: Jun. 19, 2012

(54) VERTICAL JUNCTION FIELD EFFECT TRANSISTORS HAVING SLOPED SIDEWALLS AND METHODS OF MAKING

(75) Inventors: David C. Sheridan, Starkville, MS (US); Andrew P. Ritenour, Starkville, MS (US)

(73) Assignee: SS SC IP, LLC, Jackson, MS (US)

( * ) Notice: Subject to any disclaimer, the term of this patent is extended or adjusted under 35 U.S.C. 154(b) by 67 days.

(21) Appl. No.: 12/896,130

(22) Filed: Oct. 1, 2010

(65) Prior Publication Data

US 2011/0020991 A1 Jan. 27, 2011

Related U.S. Application Data

(62) Division of application No. 12/613,065, filed on Nov. 5, 2009.

(60) Provisional application No. 61/111,437, filed on Nov. 5, 2008.

(51) Int. Cl.
*H01L 21/82* (2006.01)
*H01L 29/24* (2006.01)

(52) U.S. Cl. ........ 438/192; 438/137; 438/138; 438/156; 438/212; 438/268; 257/77; 257/134; 257/135; 257/136; 257/272; 257/286; 257/328; 257/330; 257/E27.148; 257/E29.313; 257/E29.134; 257/E31.073

(58) Field of Classification Search .................. 438/137, 438/138, 156, 192, 212, 268; 257/77, 134, 257/135, 136, 272, 286, 328, 330, E27.148, E29.313, E29.134, E31.073
See application file for complete search history.

(56) References Cited

U.S. PATENT DOCUMENTS

| | | | |
|---|---|---|---|
| 4,262,296 A | 4/1981 | Shealy et al. | |
| 5,747,831 A | 5/1998 | Loose et al. | |
| 5,903,020 A | 5/1999 | Siergiej et al. | |
| 6,917,054 B2 | 7/2005 | Onose et al. | |
| 2002/0146886 A1 | 10/2002 | Chern | |
| 2003/0025147 A1 | 2/2003 | Nomoto et al. | |
| 2007/0058418 A1 | 3/2007 | Kihara | |
| 2007/0187715 A1 | 8/2007 | Zhao | |
| 2009/0278137 A1 | 11/2009 | Sheridan et al. | |
| 2009/0278177 A1* | 11/2009 | Sankin et al. | 257/272 |

* cited by examiner

*Primary Examiner* — Dao H Nguyen
(74) *Attorney, Agent, or Firm* — Morris, Manning & Martin, LLP; Christopher W. Raimund

(57) ABSTRACT

Semiconductor devices and methods of making the devices are described. The devices can be junction field-effect transistors (JFETs). The devices have raised regions with sloped sidewalls which taper inward. The sidewalls can form an angle of 5° or more from vertical to the substrate surface. The devices can have dual-sloped sidewalls in which a lower portion of the sidewalls forms an angle of 5° or more from vertical and an upper portion of the sidewalls forms an angle of <5° from vertical. The devices can be made using normal (i.e., 0°) or near normal incident ion implantation. The devices have relatively uniform sidewall doping and can be made without angled implantation.

18 Claims, 9 Drawing Sheets

Lot Name_____SABJY-EB-E10D1-06-Final
Device Name_____1200 E1 V2 2000x2000
Wafer Name_____1

| Test Name | Min Limit | Max Limit | Yield |
|---|---|---|---|
| #2001 Igs (Vgs=-5 V) | -0.0003 | 0.0001 | 86.16 % |
| #2002 Gate Current Vgs=-10 V | -0.0003 | 0.0001 | 1.08 % |

Total = 925;  Good = 10;  Yield = 1.081 %.

FIG. 5A

Lot Name_____SABJY-EB-E110F-18-Final
Device Name_____1200 E1 V2 2000x2000
Wafer Name_____1

| Test Name | Min Limit | Max Limit | Yield |
|---|---|---|---|
| #2001 Igs (Vgs=-5 V) | -0.0003 | 0.0001 | 76.22 % |
| #2002 Gate Current Vgs=-10 V | -0.0003 | 0.0001 | 72.54 % |

Total = 925;  Good = 671;  Yield = 72.541 %.

FIG. 5B

| Device Type | Maximum Limit for Gate-Source Current ($I_{gs}$) at $V_{gs}$=-10V | % Devices In Spec |
|---|---|---|
| Single Slope | 0.0003 A | 1.1 % |
| Dual Slope | 0.0003 A | 72.5 % |

FIG. 5C

VERTICAL JUNCTION FIELD EFFECT TRANSISTORS HAVING SLOPED SIDEWALLS AND METHODS OF MAKING

This application is a divisional of U.S. patent application Ser. No. 12/613,065, filed on Nov. 5, 2009, pending, which claims the benefit of Provisional U.S. Patent Application Ser. No. 61/111,437, filed on Nov. 5, 2008. Each of the above-referenced applications is incorporated by reference herein in its entirety.

STATEMENT REGARDING FEDERALLY SPONSORED RESEARCH

This invention was made with U.S. Government support under Contract No. FA8650-06-D-2680, awarded by the U.S. Air Force Research Laboratory. The U.S. Government may have certain rights in this invention.

The section headings used herein are for organizational purposes only and should not be construed as limiting the subject matter described herein in any way.

BACKGROUND

1. Field

This application relates generally to semiconductor devices and to methods of making the devices.

2. Background of the Technology

To date, vertical channel silicon carbide junction field effect transistors have been proposed as devices with vertical or near vertical sidewalls [1, 2]. In devices with vertical or near vertical sidewalls, however, it can be difficult to achieve uniform p+ sidewall doping using ion implantation. In particular, normal incident ion implantation can result in non-uniformly doped sidewalls having a low dopant concentration.

The use of angled ion implantation to dope the sidewalls has been disclosed [1]. Even with this approach, however, it is difficult to achieve an idealized structure having uniform channel width ($w_{ch}$). In particular, the use of an angled implantation can still result in heavier doping near the trench bottom and non-uniform doping along the sidewall which reduces device performance. Furthermore, to insure similar doping on both sidewalls the wafer has to be rotated during implantation. For SiC, however, ion implantation requires multiple implants at different energies. Therefore, a process involving rotation of the wafer and angled implantation can add significantly to the complexity and cost of the manufacturing process.

Accordingly, there still exists a need for improved methods of making semiconductor devices such as vertical JFETs with more uniform and well-controlled channel width.

SUMMARY

A semiconductor device is provided which comprises:
a substrate layer of a semiconductor material of a first conductivity type;
a channel layer of a semiconductor material of the first conductivity type on an upper surface of the substrate layer, the channel layer comprising one or more raised regions comprising an upper surface and first and second sidewalls separated by a lower surface, wherein the first and second sidewalls of the raised regions adjacent the lower surface are tapered inward and form an angle of at least 5° from vertical to the upper surface of the substrate layer, wherein the one or more raised regions comprises an inner portion of a semiconductor material of the first conductivity type and outer portions of a semiconductor material of a second conductivity type different than the first conductivity type, wherein the outer portions are adjacent to the first and second sidewalls;
gate regions of semiconductor material of the second conductivity type in the lower surface of the channel layer adjacent to and contiguous with the outer portions of adjacent raised regions; and
a source layer of a semiconductor material of the first conductivity type on the upper surfaces of the one or more raised regions.

A method is also provided which comprises:
implanting ions into a channel layer of a semiconductor material of a first conductivity type to form implanted gate regions of semiconductor material of a second conductivity type different than the first conductivity type, wherein the channel layer is on an upper surface of a substrate layer and wherein the channel layer comprises one or more raised regions comprising an upper surface and first and second sidewalls separated by a lower surface, wherein the first and second sidewalls of the raised regions adjacent the lower surface are tapered inward and form an angle of at least 5° from vertical to the upper surface of the substrate, wherein the implanted gate regions are formed in the sidewalls and in the lower surface of the channel layer; and
forming a source layer of a semiconductor material of the first conductivity type on the upper surfaces of the one or more raised regions.

These and other features of the present teachings are set forth herein.

BRIEF DESCRIPTION OF THE DRAWINGS

The skilled artisan will understand that the drawings, described below, are for illustration purposes only. The drawings are not intended to limit the scope of the present teachings in any way.

FIGS. 5A and 5B are tables showing device yield for gate-source leakage at Vgs=−5V and −10V for single slope (FIG. 5A) and dual-slope (FIG. 5B) devices.

FIG. 5C is a Table summarizing the data from FIGS. 5A and 5B for single slope and dual slope devices.

DESCRIPTION OF THE VARIOUS EMBODIMENTS

For the purposes of interpreting this specification, the use of "or" herein means "and/or" unless stated otherwise or where the use of "and/or" is clearly inappropriate. The use of "a" herein means "one or more" unless stated otherwise or where the use of "one or more" is clearly inappropriate. The use of "comprise," "comprises," "comprising," "include," "includes," and "including" are interchangeable and not intended to be limiting. Furthermore, where the description of one or more embodiments uses the term "comprising," those skilled in the art would understand that, in some specific instances, the embodiment or embodiments can be alternatively described using the language "consisting essentially of" and/or "consisting of." It should also be understood that in some embodiments the order of steps or order for performing certain actions is immaterial so long as the present teachings remain operable. Moreover, in some embodiments two or more steps or actions can be conducted simultaneously.

Vertical channel silicon carbide junction field effect transistors have been proposed as devices with vertical or nearly vertical sidewalls [1], [2]. Devices having vertical sidewalls have several disadvantages. First, it is difficult to achieve uniform $p^+$ sidewall doping using straightforward fabrication processes (e.g., ion implantation).

Figures 1A, 1B:
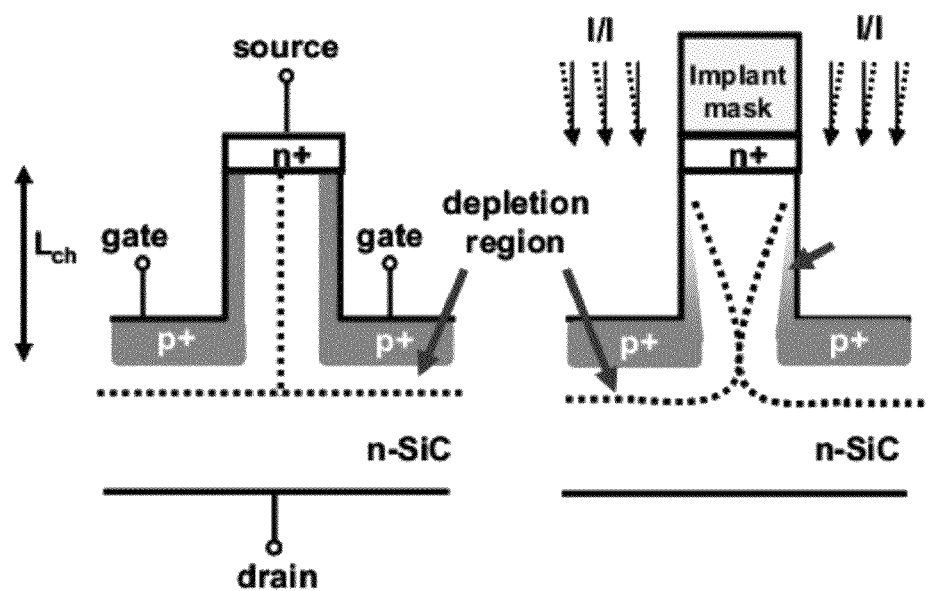
FIGS. 1A-1D are schematics of idealized (FIGS. 1A and 1C) and actual (FIGS. 1B and 1D) structures of normally-off SiC VJFETs with ion-implanted vertical sidewalls wherein depletion regions around the gate are shown for zero gate bias (i.e., off-state) (FIGS. 1A and 1B) and for a positive voltage greater than the threshold voltage (i.e., on-state) (FIGS. 1C and 1D) wherein the device terminals (gate, source, and drain) are shown in FIG. 1A and also apply to FIGS. 1B, 1C, and 1D.
Figures 1C, 1D:
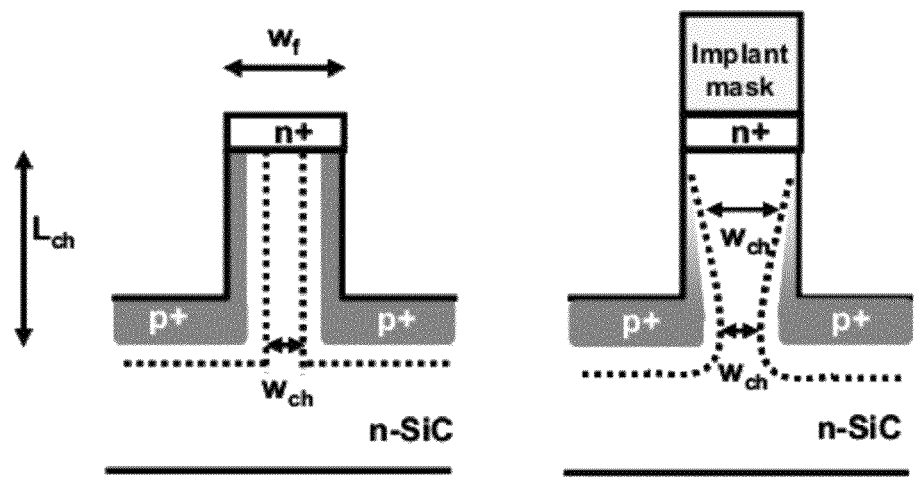

Idealized structures having uniformly doped sidewalls are shown schematically in FIG. 1A (off-state) and in FIG. 1C (on-state). Normal incident ion implantation, however, results in non-uniform, low doped sidewalls as shown in the actual structures depicted in FIG. 1B (off-state) and FIG. 1D (on-state).

It has been proposed to use angled ion implantation to dope the sidewalls [1]. Even with this approach, however, it is not possible to achieve the idealized structure with uniform channel width ($w_{ch}$) as shown in FIGS. 1A (off-state) and 1C (on-state). In particular, an angled implant will still result in heavier doping near the trench bottom and non-uniform doping along the sidewall. Furthermore, for angled ion implantation the wafer must be rotated during implantation to insure similar doping on both sidewalls. Unfortunately, ion implantation for SiC is expensive. In particular, there is very little diffusion in SiC so the desired profile must be achieved via implantation (i.e., the "as implanted" profile). As a result, multiple implants at different energies are often required to achieve the desired profile. In addition, for SiC devices the substrate is usually heated to high temperatures (e.g., ~600° C.) during implantation to reduce lattice damage. Therefore, a manufacturing process involving rotation of the wafer and angled implantation adds significantly to the process complexity and cost.

A schematic of an actual device having some degree of variation in $w_{ch}$ along the length of the channel ($L_{ch}$) is shown in FIG. 1B (off-state) and FIG. 1D (on-state). The electrical characteristics of the device will be determined by the point or segment of the channel where the depletion regions from the opposing gates meet. Overlap of the depletion regions at the narrowest point of the channel creates an energy barrier between the drain and source thus preventing current flow. The height and shape of the barrier simultaneously determines the forward conduction characteristics (including the threshold voltage) as well as the reverse blocking characteristics of the device. The finger width ($w_f$) of the device determines whether the device is normally-on or normally-off at zero gate bias. For large $w_f$, the depletion regions of the opposing gate-channel p-n junctions do not overlap and a conducting channel exists at zero gate bias (i.e., normally-on device/negative threshold voltage). As $w_f$ is reduced, overlap of the depletion regions prevents current flow at zero bias (i.e. normally-off device/positive threshold voltage).

The degree of overlap sets the barrier at zero gate bias and consequently the threshold voltage. For a normally-off device, the barrier at zero gate bias should be able to prevent excessive current flow at the rated blocking voltage. A high drain voltage lowers the barrier through the well-known drain-induced barrier lowering (DIBL) phenomenon. The DIBL effect is reduced as the barrier is moved away from the drain and closer to the source. This highlights another obvious disadvantage of ion-implanted vertical sidewalls: the channel width ($w_{ch}$) is narrow at the drain-end of the channel (see FIG. 1D). As a result, the barrier formed there is very susceptible to DIBL, which consequently reduces the blocking voltage of the device. In effect, the device has poor electrostatic integrity.

A related issue is reduced saturation current in the on-state. When the gate bias is increased above the threshold voltage, the gate depletion region decreases and a conducting channel is formed between drain and source. However, for large drain voltages, the gate-drain p-n junction becomes reverse biased and the depletion region at the drain-end of the channel increases until the conducting channel is pinched off and the current "saturates". The practical implementation of a JFET with vertical sidewalls and implanted gate will have a narrow $w_{ch}$ at the drain-end of the channel and therefore pinch-off at low drain bias leading to undesirably low saturation current.

Figure 2:
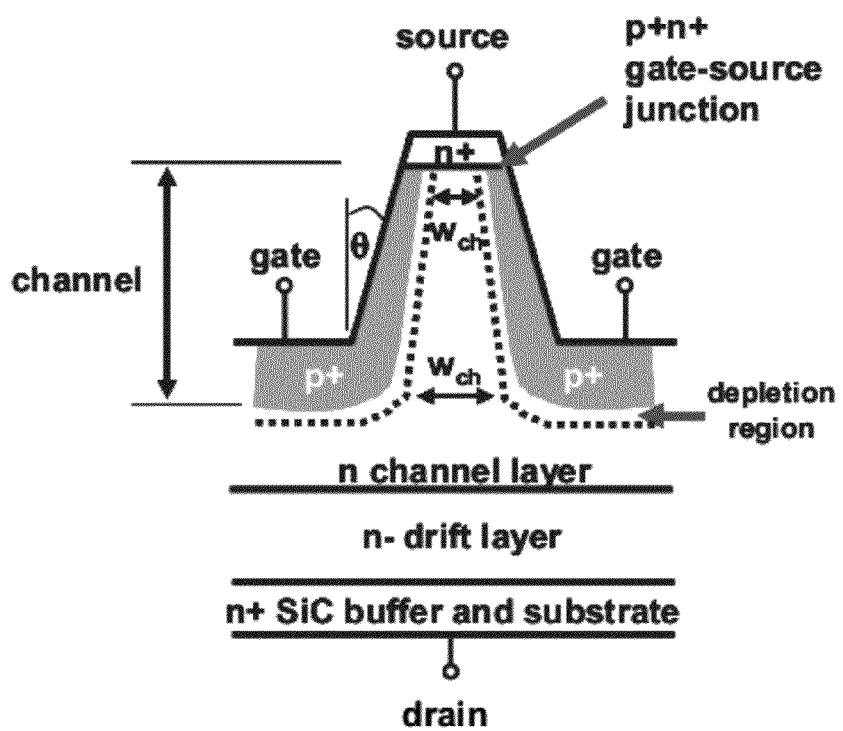
FIG. 2 is a schematic of a vertical junction field effect transistor (VJFET) with sloped sidewalls.

According to some embodiments, a vertical channel JFET with sloped sidewalls is provided. A device of this type is depicted in FIG. 2. As shown in FIG. 2, the device comprises an n+ substrate, an n+ buffer layer on the substrate, an n− drift layer on the buffer layer and an n channel layer on the drift layer. As also shown in FIG. 2, the channel layer comprises a raised region having an upper surface opposite the drift layer. A source layer is on the upper surface of the raised region.

As also shown in FIG. 2, the raised region has sloped sidewalls which form an angle θ with a line drawn perpendicular to the substrate surface. According to some embodiments, the sidewalls can be sloped sufficiently to insure that the channel width ($w_{ch}$) at the source end of the channel is smaller than $w_{ch}$ at the drain end of the channel. To meet this requirement, the sidewall angle θ can be greater than 5° for common structures. The advantages of this structure include the following:

In the off-state, the barrier to electron flow from source to drain is located at source (furthest from the drain) which reduces DIBL and increase the blocking voltage of the device;

The wide channel at the drain-end increases the drain voltage required to pinch-off the channel during the on-state, thereby increasing the saturation current; and This structure is compatible with normal-incident ion implantation thus simplifying the implant process and reducing cost.

If the gate region is formed by ion implantation, the region between the source and gate can be heavily implanted resulting in lattice damage as well as a $p^+n^+$ gate-source junction (see FIG. 2) with a narrow depletion region and hence a high electric field. These factors could lead to increased gate-source leakage. Therefore, according to some embodiments, a device is provided having dual slope sidewalls as shown in FIG. 3.

Figure 3:
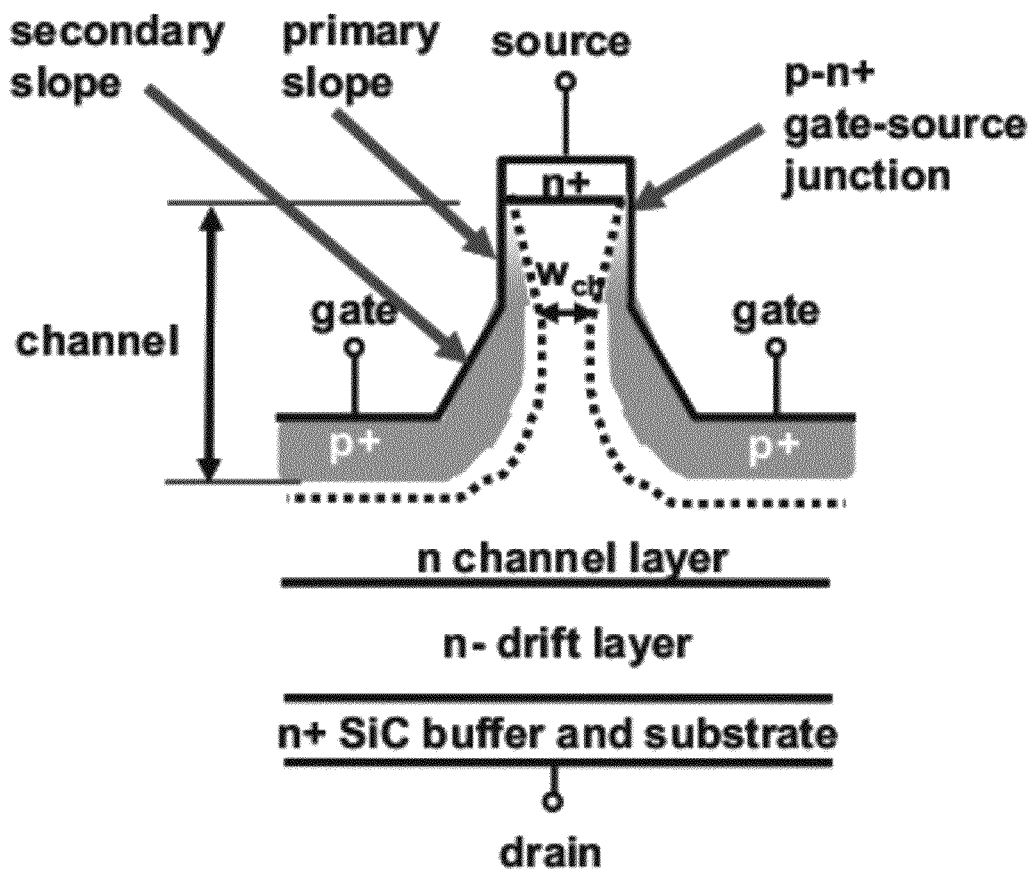
FIG. 3 is a schematic of a vertical junction field effect transistor (VJFET) with dual sloped sidewalls.

As shown in FIG. 3, the device comprises an n+ substrate, an n+ buffer layer on the substrate, an n− drift layer on the buffer layer and an n channel layer on the drift layer. The channel layer comprises a raised region having an upper surface opposite the drift layer. An n+ source layer is on the upper surface of the raised region.

As shown in FIG. 3, the dual-slope sidewall comprises an upper primary slope segment and lower secondary slope segment. According to some embodiments, the primary slope is approximately vertical (e.g. θ less than +/−5°). As the primary slope approaches vertical, the p-type implant concentration and hence the implant damage can be reduced at the gate-source junction.

In the dual-slope device, the electron barrier is located at the start of the secondary slope. Therefore, according to some embodiments, the secondary slope can be located as close to the source as possible. According to some embodiments, the secondary slope can start no further away from the source than half of the channel length. This is closer to the drain than in the single slope sidewall case but still further away than in the vertical sidewall case. The angle of the secondary slope can be greater than 5°. Accordingly, the dual-slope sidewall provides improved DIBL and saturation current relative to the vertical sidewall device while still reducing the p-type doping concentration and implant damage near the gate-source p-n junction, both of which reduce gate-source leakage.

The devices having sloped sidewalls as described herein can be vertical junction field effect transistors in general (e.g., both normally-on and normally-off transistors) fabricated using known semiconductors.

Figure 4A:
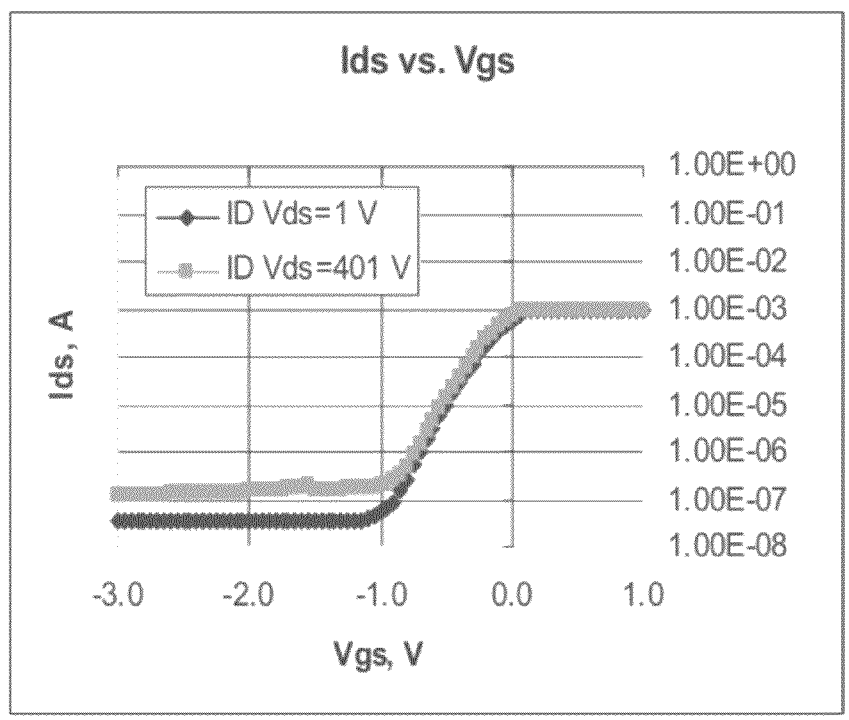
FIGS. 4A and 4B are graphs showing VJFET device characteristics ($I_d$-$V_g$: drain current vs. gate voltage) as a function of drain voltage for single slope (FIG. 4A) and dual-slope (FIG. 4B) devices wherein the degree of DIBL is indicated by the negative shift of the $I_d$-$V_g$ curve with increasing drain voltage.
Figure 4B:
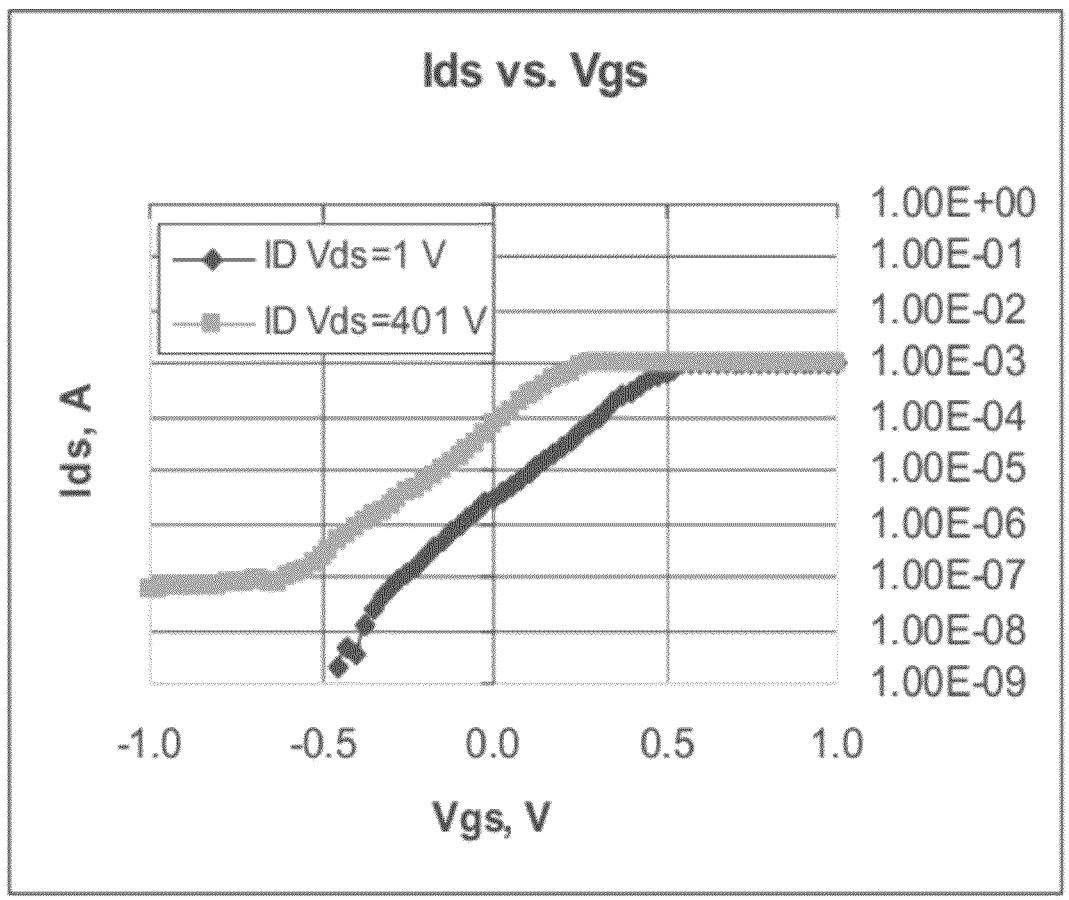

FIGS. 4A and 4B show device characteristics ($I_d$-$V_g$: drain current vs. gate voltage) as a function of drain voltage for a single slope device (FIG. 4A) and a dual-slope device (FIG. 4B). The degree of DIBL is indicated by the negative shift of the $I_d$-$V_g$ curve with increasing drain voltage. As can be seen from FIGS. 4A and 4B, the single slope device has less DIBL than the dual slope device. The dual slope device, in turn, has less DIBL than a vertical sidewall device.

As described above, the single slope device has less DIBL than the dual slope device which in turn has less DIBL than a vertical sidewall device. One of the main advantages of the dual-slope structure (i.e., reduced gate-source leakage) can be seen by examining the device yield for gate-source leakage.

FIG. 5A shows gate-source leakage yield for a single slope device while FIG. 5B shows gate-source leakage yield for a dual-slope device. The devices were fabricated simultaneously with the only difference being the finger profile (i.e. single slope vs. dual slope). The dual-slope device shows less leakage, and hence higher yield, particularly at $V_{gs}$=−10V. FIG. 5C is a Table summarizing the data from FIGS. 5A and 5B for single slope and dual slope devices.

Figure 6A:
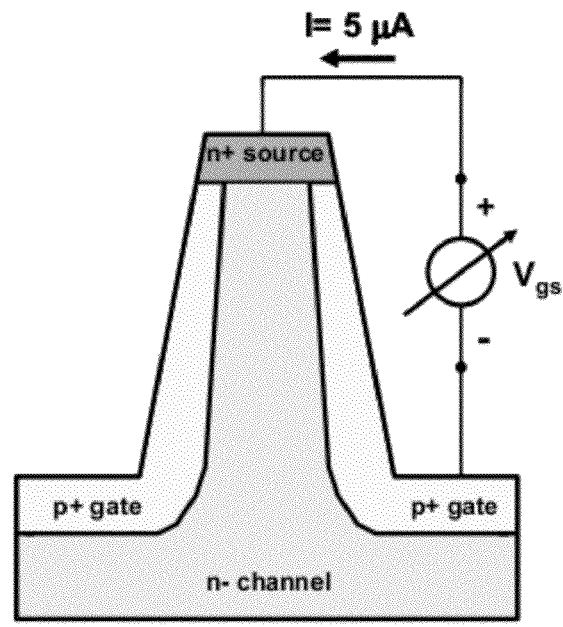
FIGS. 6A and 6B are schematics showing the measurement of gate-source (G-S) leakage for devices with single-slope (FIG. 6A) and multi-slope (FIG. 6B) fingers.
Figure 6B:
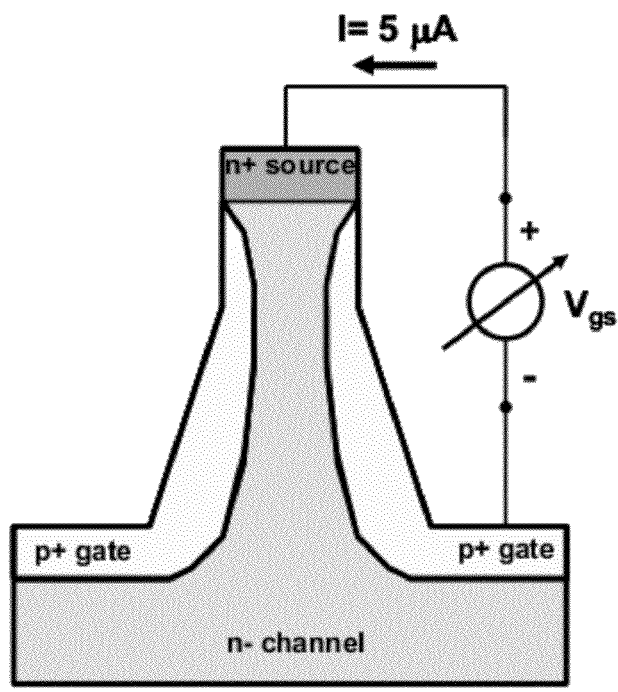

FIGS. 6A and 6B are schematics showing the measurement of gate-source (G-S) leakage for devices with single-slope (FIG. 6A) and multi-slope (FIG. 6B) fingers. Gate-source voltage ($V_{gs}$) was measured for 5 μA reverse leakage.

Figure 7:
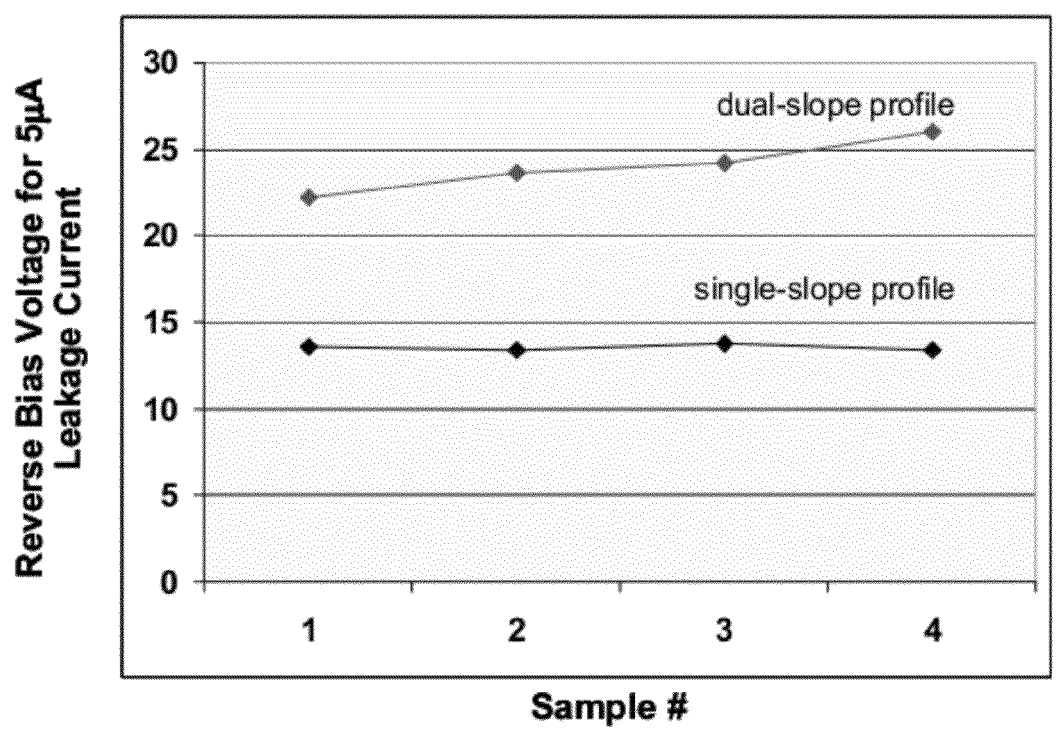
FIG. 7 is a graph showing reverse bias voltage corresponding to a leakage current of 5 µA for devices with single-slope and multi-slope fingers.

FIG. 7 is a graph showing reverse bias voltage corresponding to a leakage current of 5 μA for devices with single-slope and multi-slope fingers as shown in FIGS. 6A and 6B, respectively. As shown in FIG. 7, reverse bias voltage corresponding to a leakage current of 5 μA is much higher for devices with multi-slope fingers compared to single-slope fingers. As also can be seen in FIG. 7, the device with the dual-slope profile clearly demonstrates less reverse gate-source leakage than the device with the single-slope profile.

Figure 8:
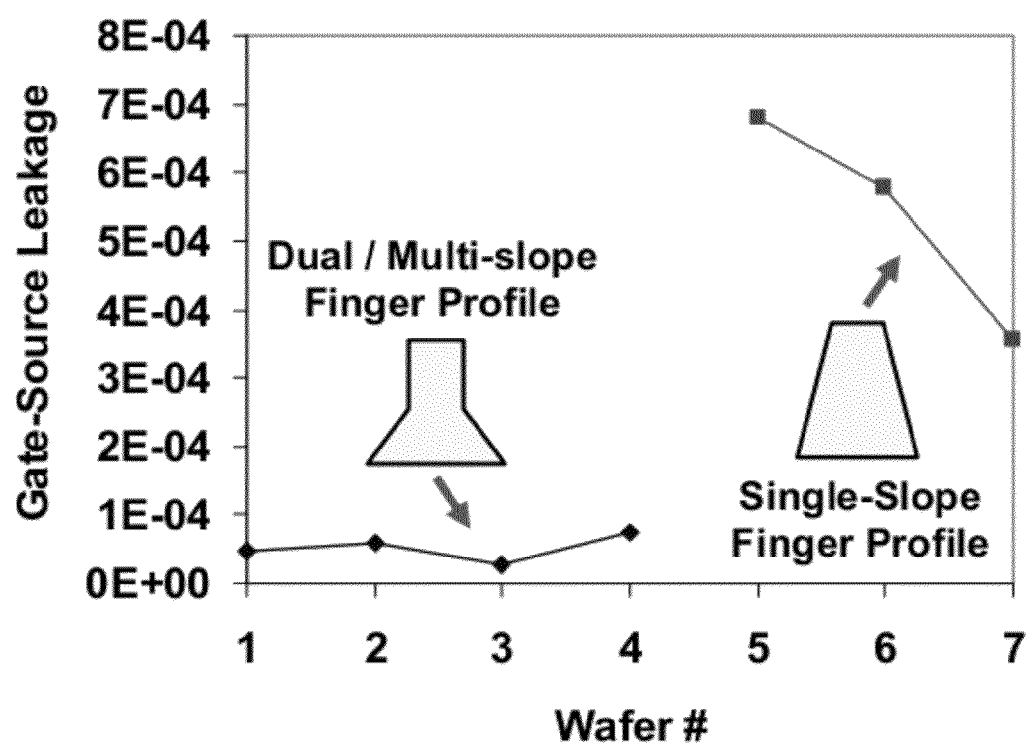
FIG. 8 is a graph showing gate-source P-N junction reverse leakage measured in amps at a $V_{gs}$ of −15 V for devices with single-slope and multi-slope fingers.

FIG. 8 is a graph showing gate-source P-N junction reverse leakage measured in amps at a gate-source voltage ($V_{gs}$) of −15 V for devices with single-slope and multi-slope fingers.

As can be seen from FIG. 8, gate-source leakage is much higher for the device with the single-slope profile.

The semiconductor material used to manufacture the devices can be a wide-bandgap semiconductor material (i.e., a semiconductor material with $E_G$>2 eV). Exemplary non-limiting examples of wide-bandgap semiconductor materials include silicon carbide (SiC) and Group III nitride compounds (e.g., gallium nitride GaN).

The layers of the device can be formed by doping the layers with donor or acceptor materials using known techniques. Exemplary donor materials for SiC include nitrogen and phosphorus. Nitrogen is a preferred donor material for SiC. Exemplary acceptor materials for doping SiC include boron and aluminum. Aluminum is a preferred acceptor material for SiC. The above materials are merely exemplary, however, and any acceptor and donor materials which can be doped into silicon carbide can be used.

The dopant concentrations and thicknesses of the various layers of the device described herein can be varied to produce a device having desired characteristics for a particular application. Similarly, the dimensions of the various features of the device can also be varied to produce a device having desired characteristics for a particular application. The channel layer can have thickness of 0.5 to 5 μm and a doping concentration of $1\times10^{16}$ to $1\times10^{18}$ cm$^{-3}$. The drift layer can have a thickness of 5 to 15 μm and a doping concentration of $4\times10^{15}$ to $2\times10^{16}$ cm$^{-3}$. The substrate can have a thickness of 100 to 500 μm and a doping concentration of $1\times10^{19}$ to $5\times10^{19}$ cm$^{-3}$. The source layer can have a thickness of 0.1 to 1.0 μm and a doping concentration of $1\times10^{19}$ to $1\times10^{20}$ cm$^{-3}$. The implanted gate regions can have a doping concentration of $5\times10^{18}$ to $1\times10^{20}$ cm$^{-3}$. The optional buffer layer can have a thickness of 0.1 to 1.0 μm and a doping concentration of $5\times10^{17}$ to $5\times10^{18}$ cm$^{-3}$. These dopant concentrations and thicknesses are merely exemplary and are not intended to be limiting.

The buffer, drift, channel and source layers of semiconductor material can be formed by epitaxial growth on a suitable substrate. The layers can be doped during epitaxial growth.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] U.S. Patent Application Publication No. 2007/0187715 A1, "Power Junction Field Effect Power Transistor with Highly Vertical Channel and Uniform Channel Opening"
[2] U.S. Pat. No. 5,903,020, "Silicon Carbide Static Induction Transistor Structure"

What is claimed is:
1. A method comprising:
   implanting ions into a channel layer of a semiconductor material of a first conductivity type to form implanted gate regions of semiconductor material of a second conductivity type different than the first conductivity type, wherein the channel layer is on an upper surface of a substrate layer and wherein the channel layer comprises one or more raised regions comprising an upper surface and first and second sidewalls separated by a lower surface, wherein the first and second sidewalls of the raised regions are tapered inward and form a first angle adjacent the lower surface and a second angle adjacent the upper surface, wherein the first angle is at least 5° from vertical to the upper surface of the substrate layer and wherein the second angle is <5° from vertical to the upper surface of the substrate layer, wherein the implanted gate regions are formed in the sidewalls and in the lower surface of the channel layer; and forming a source layer of a semiconductor material of the first conductivity type on the upper surfaces of the one or more raised regions;

wherein the first and second sidewalls adjacent the lower surface of the channel layer are tapered inward and form an angle of at least 5° from vertical to the upper surface of the substrate layer for at least half of the distance between a lower surface of the gate region proximate the substrate layer and the upper surface of the raised regions.

2. The method of claim 1, wherein the ions are implanted into the channel layer at an angle of +/−2° from vertical to the upper surface of the substrate.

3. The method of claim 1, wherein the first and second sidewalls adjacent the upper surfaces of the one or more raised regions are oriented at an angle of <2° from vertical to the upper surface of the substrate layer.

4. The method of claim 1, further comprising a drift layer of a semiconductor material of the first conductivity type between the substrate and the channel layer.

5. The method of claim 4, further comprising a buffer layer between the substrate and the drift layer.

6. The method of claim 1, further comprising a buffer layer between the substrate and the channel layer.

7. The method of claim 1, wherein the device comprises a plurality of raised regions, wherein the plurality of raised regions are elongate and are arranged in spaced relationship as fingers.

8. The method of claim 1, wherein the semiconductor material of the first conductivity type is an n-type semiconductor material and wherein the semiconductor material of the second conductivity type is a p-type semiconductor material.

9. The method of claim 1, further comprising:
forming a gate contact on the lower surface of the channel layer;
forming a source contact on the source layer; and
forming a drain contact on the substrate layer opposite the channel layer.

10. A method comprising:
implanting ions into a channel layer of a semiconductor material of a first conductivity type to form implanted gate regions of semiconductor material of a second conductivity type different than the first conductivity type, wherein the channel layer is on an upper surface of a substrate layer and wherein the channel layer comprises a plurality of raised regions comprising an upper surface and first and second sidewalls separated by a lower surface, wherein the raised regions are elongate and are arranged in spaced relationship as fingers and wherein the first and second sidewalls of the raised regions adjacent the lower surface are tapered inward and form an angle of at least 5° from vertical to the upper surface of the substrate, wherein the implanted gate regions are formed in the sidewalls and in the lower surface of the channel layer; and forming a source layer of a semiconductor material of the first conductivity type on the upper surfaces of the raised regions;

wherein the first and second sidewalls adjacent the lower surface of the channel layer are tapered inward and form an angle of at least 5° from vertical to the upper surface of the substrate layer for at least half of the distance between a lower surface of the gate region proximate the substrate layer and the upper surface of the raised regions.

11. The method of claim 10, wherein the ions are implanted into the channel layer at an angle of +/−2° from vertical to the upper surface of the substrate.

12. The method of claim 10, wherein the first and second sidewalls adjacent the upper surfaces of the one or more raised regions are oriented at an angle of <5° from vertical to the upper surface of the substrate layer.

13. The method of claim 10, wherein the first and second sidewalls adjacent the upper surfaces of the one or more raised regions are oriented at an angle of <2° from vertical to the upper surface of the substrate layer.

14. The method of claim 10, further comprising a drift layer of a semiconductor material of the first conductivity type between the substrate and the channel layer.

15. The method of claim 14, further comprising a buffer layer between the substrate and the drift layer.

16. The method of claim 10, further comprising a buffer layer between the substrate and the channel layer.

17. The method of claim 10, wherein the semiconductor material of the first conductivity type is an n-type semiconductor material and wherein the semiconductor material of the second conductivity type is a p-type semiconductor material.

18. The method of claim 10, further comprising:
forming a gate contact on the lower surface of the channel layer;
forming a source contact on the source layer; and
forming a drain contact on the substrate layer opposite the channel layer.

* * * * *